(12) United States Patent
Maekawa

(10) Patent No.: US 10,234,839 B2
(45) Date of Patent: Mar. 19, 2019

(54) I/O MODULE

(71) Applicant: DENSO WAVE INCORPORATED, Chita-gun, Aichi-pref. (JP)

(72) Inventor: Takaaki Maekawa, Chita-gun (JP)

(73) Assignee: DENSO WAVE INCORPORATED, Chita-gun (JP)

( * ) Notice: Subject to any disclaimer, the term of this patent is extended or adjusted under 35 U.S.C. 154(b) by 23 days.

(21) Appl. No.: 15/679,640

(22) Filed: Aug. 17, 2017

(65) Prior Publication Data

US 2018/0052434 A1    Feb. 22, 2018

(30) Foreign Application Priority Data

Aug. 22, 2016   (JP) ................................. 2016-162105

(51) Int. Cl.
| | |
|---|---|
| *G06F 11/00* | (2006.01) |
| *G05B 19/042* | (2006.01) |
| *G06F 13/12* | (2006.01) |
| *G06F 13/14* | (2006.01) |
| *G06F 13/16* | (2006.01) |
| *G11C 7/10* | (2006.01) |
| *H02J 3/08* | (2006.01) |
| *H02J 9/06* | (2006.01) |

(52) U.S. Cl.
CPC .......... *G05B 19/0423* (2013.01); *G06F 11/00* (2013.01); *G06F 13/126* (2013.01); *G06F 13/14* (2013.01); *G06F 13/1689* (2013.01); *G11C 7/1045* (2013.01); *H02J 3/08* (2013.01); *H02J 9/061* (2013.01)

(58) Field of Classification Search
None
See application file for complete search history.

(56) References Cited

U.S. PATENT DOCUMENTS

| | | | | |
|---|---|---|---|---|
| 4,785,262 | A * | 11/1988 | Ryu ....................... | H03K 3/011 327/114 |
| 5,611,623 | A * | 3/1997 | Lawson ................ | G01F 23/266 374/170 |
| 7,992,029 | B2 * | 8/2011 | Leis .......................... | G06F 1/30 327/143 |

(Continued)

FOREIGN PATENT DOCUMENTS

JP          2010-039749 A     2/2010

*Primary Examiner* — Cheng Yuan Tseng
(74) *Attorney, Agent, or Firm* — Oliff PLC

(57) ABSTRACT

In an I/O module, a communication enables communications between first and second external devices upon a voltage being supplied from a power source thereto. A shutoff switch shuts off supply of the voltage to the communication controller when turned off. A capacitor is charged based on the voltage supplied from the voltage source while the shutoff switch is in an on state. The capacitor supplies an operating voltage to the communication controller while the shutoff switch is turned off. The communication controller detects a voltage across the capacitor as a diagnostic voltage, and outputs a turn-off command to the shutoff switch for turning off the shutoff switch. The communication controller determines whether there is a fixedly closed malfunction in the shutoff switch based on the diagnostic voltage while outputting the turn-off command to the shutoff switch.

10 Claims, 9 Drawing Sheets

(56) References Cited

U.S. PATENT DOCUMENTS

| | | | | |
|---|---|---|---|---|
| 8,217,915 B2* | 7/2012 | Philipp | ............... | G06F 3/03547 |
| | | | | 345/174 |
| 9,081,454 B2* | 7/2015 | Cleary | .................. | G06F 3/0416 |
| 9,312,777 B2* | 4/2016 | Lefedjiev | .......... | H02M 3/33523 |
| 9,531,276 B2* | 12/2016 | Knoll | .................... | H02M 7/217 |

* cited by examiner

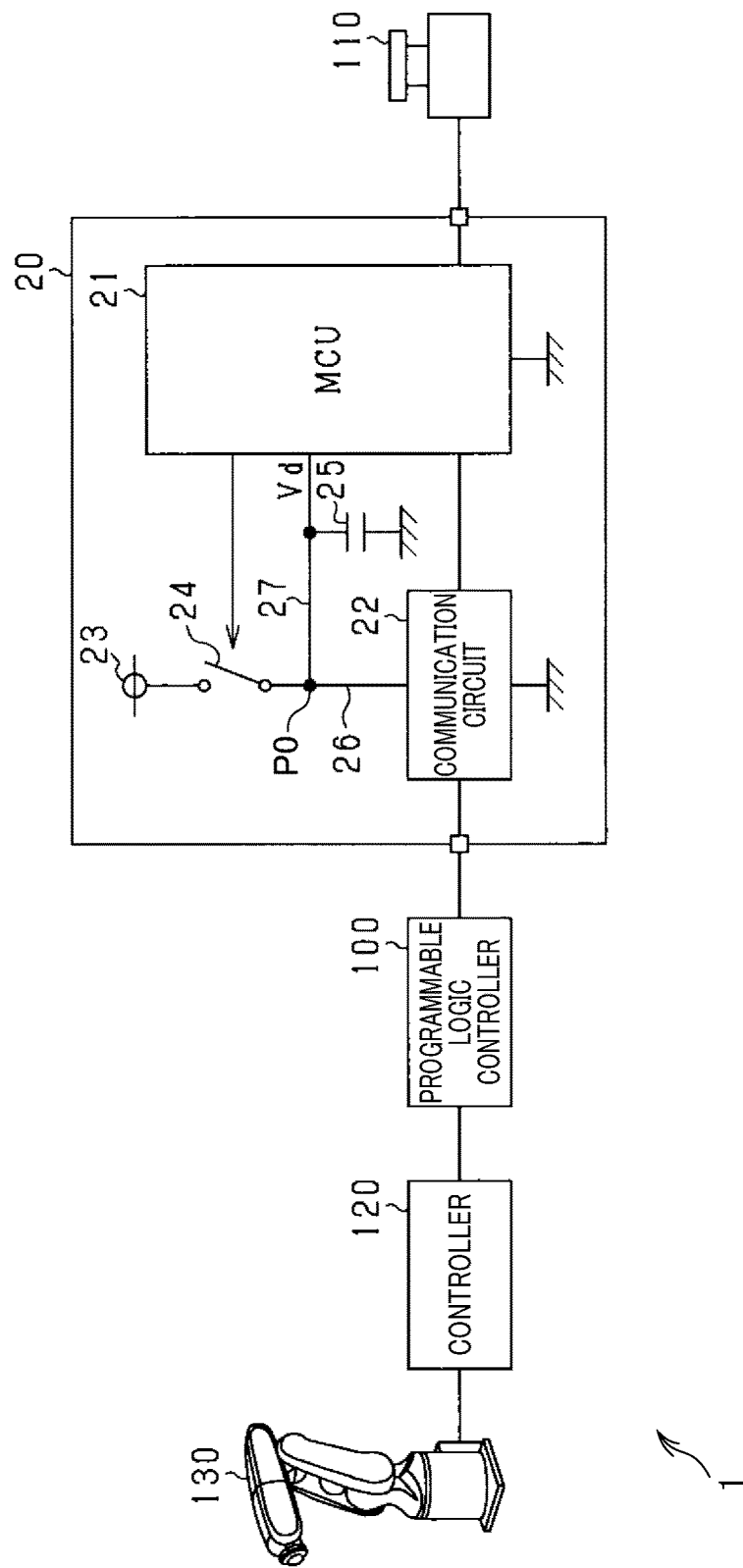

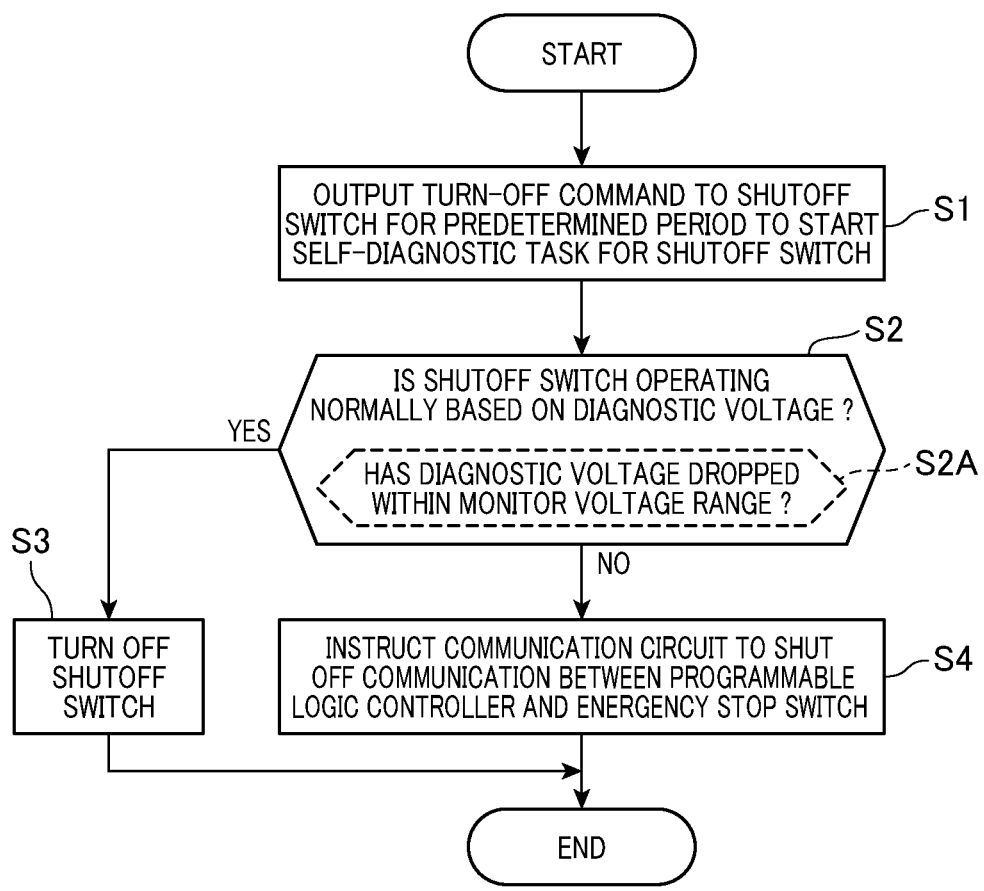

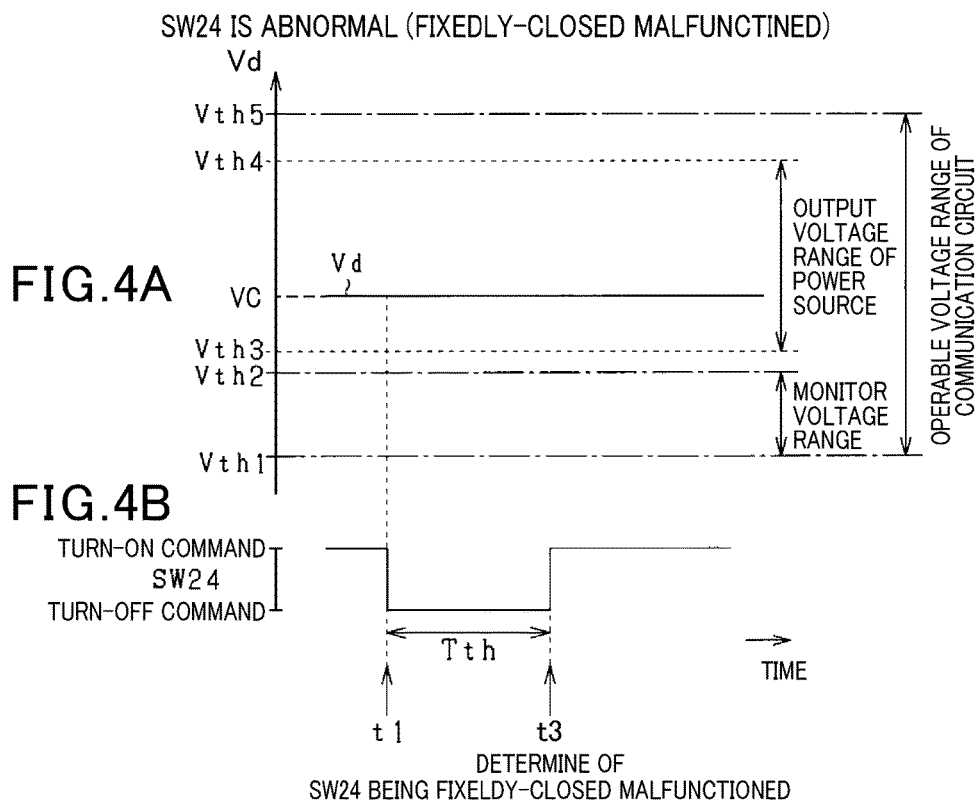

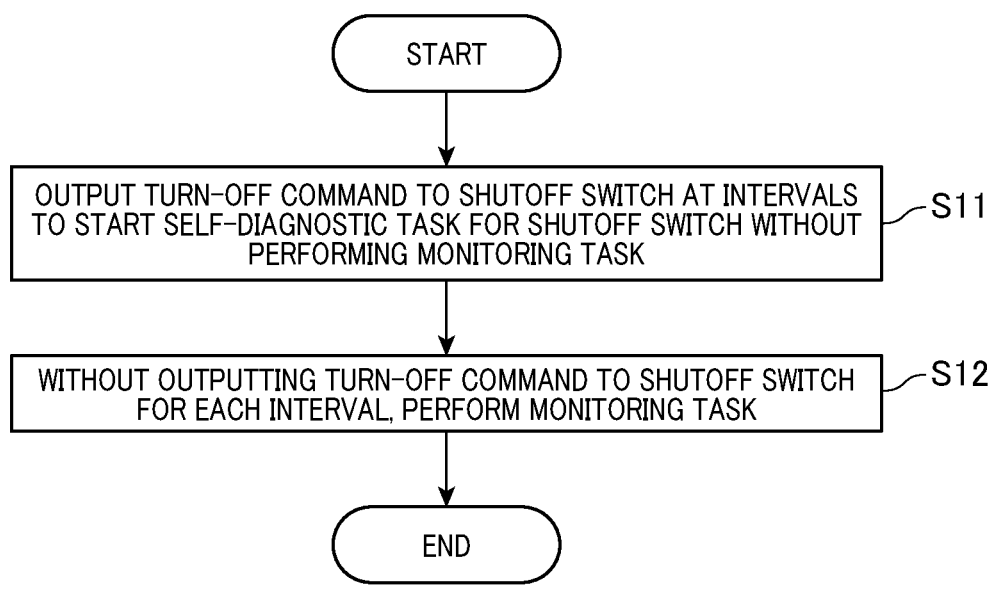

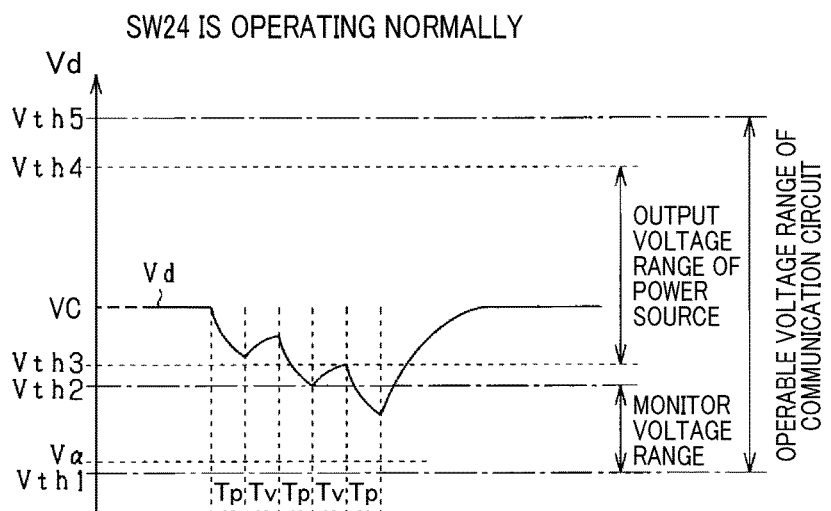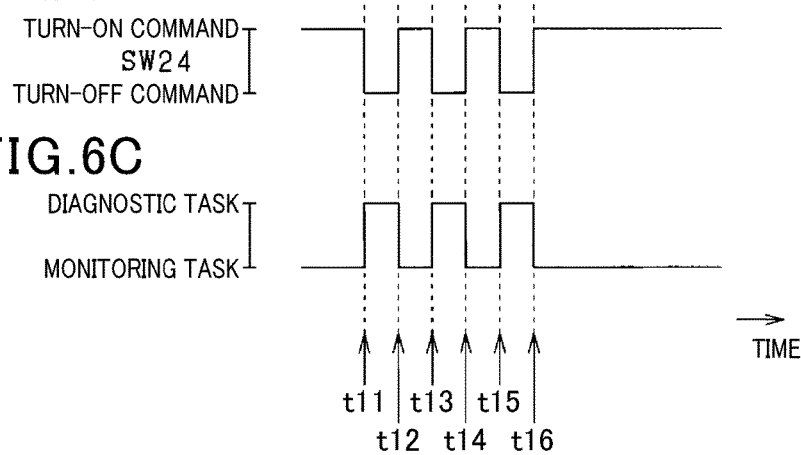

I/O MODULE

CROSS REFERENCE TO RELATED APPLICATIONS

This application is based on and claims the benefit of priority from Japanese Patent Application 2016-162105 filed on Aug. 22, 2016, the disclosure of which is incorporated in its entirety herein by reference.

TECHNICAL FIELD

The present disclosure relates to input/output (I/O) modules.

BACKGROUND

I/O modules are operative to enable plural external devices to communicate with each other. An example of these I/O modules, which is used to enable programmable logic controllers to communicate with each other, is disclosed in Japanese Patent Application Publication 2010-39740.

SUMMARY

I/O modules are also used to enable a programmable logic controller, which is operative to output various control commands to an industrial robot, and an emergency stop switch to communicate with each other.

Specifically, a shutoff switch is located between a power source and a communication circuit, and the communication circuit is connected between a programmable logic controller and an emergency stop switch. A microcomputer of an I/O module maintains a shutoff switch in an on state to enable electrical power to be supplied from the power source to the communication circuit. This enables the programmable logic controller and the emergency stop switch to communicate with each other via the communication circuit.

If the emergency stop switch is turned on so that an emergency signal is sent from the emergency stop switch to the microcomputer, the microcomputer sends a turn-off command to the shutoff switch to cause the shutoff switch to be turned off, thus shutting off power supply from the power source to the communication circuit. This shuts off the communication circuit, disabling the programmable logic controller from communicating with the emergency stop switch. This results in the programmable logic controller outputting an operation stop signal to a controlled target device, thus disabling the controlled target device from operating.

There are requests for such an I/O module to perform a self-diagnostic task to diagnose whether there is a malfunction in the I/O module.

The self-diagnostic task diagnoses whether the shutoff switch can be switched from the on state to an off state, and shuts off the communication circuit to cause the programmable logic controller to output the operation stop signal if it is diagnosed that the shutoff switch cannot be switched from the on state to the off state.

Specifically, the microcomputer of the I/O module sends the turn-off command to the shutoff switch, which is in the on state, in predetermined diagnostic cycles, and diagnoses whether the shutoff switch is actually turned off.

However, the communication circuit needs be shut off for each of the diagnostic cycles, so that the programmable logic controller needs to output the operation stop signal to the controlled target device for each of the diagnostic cycles. This disables the programmable logic controller and the emergency stop switch from communicating with each other for each of the diagnostic cycles. This may deteriorate the operating efficiency of each of the programmable logic controller and the emergency stop switch.

In view of the circumstances, a first aspect of the present disclosure seeks to provide I/O modules for enabling communications between external devices, each of which is capable of addressing the problems set forth above.

Specifically, a second aspect of the present disclosure seeks to provide such I/O modules, each of which is capable of performing a self-diagnostic task while maintaining communications between the external devices.

According to a first exemplary aspect of the present disclosure, there is provided an I/O module to which a first external device and a second external device are connected. The I/O module includes a communication controller connected via a power supply path to a voltage source that has a predetermined output voltage range. The communication controller has an operable voltage range, and is configured to enable communications between the first external device and the second external device upon a voltage supplied from the voltage source being equal to or higher than a lower limit of the operable voltage range. The communication circuit is configured to disable communications between the first external device and the second external device upon the voltage supplied from the voltage source being lower than the lower limit of the operable voltage range.

The I/O module includes a shutoff switch provided on the power supply path, and a capacitor connected to a point of the power supply path. The point is located between the shutoff switch and the communication controller. The capacitor is charged based on the voltage supplied from the voltage source while the shutoff switch is in an on state. The capacitor is configured to supply an operating voltage to the communication controller while the shutoff switch is in an off state. A lower limit of the output voltage range of the power source is set to be higher than the lower limit of the operable range. The communication controller is configured to detect a voltage across the capacitor as a diagnostic voltage, and output a turn-off command to the shutoff switch for turning off the shutoff switch to perform a diagnostic task that determines whether there is a fixedly closed malfunction in the shutoff switch based on determination of whether the diagnostic voltage is lower than the lower limit of the output voltage range while outputting the turn-off command to the shutoff switch.

The communication controller is configured to determine that there is no fixedly closed malfunction in the shutoff switch when determining that the diagnostic voltage is lower than the lower limit of the output voltage range, thus outputting a turn-on command to the shutoff switch for turning on the shutoff switch while the diagnostic voltage is within a range from the lower limit of the output voltage range and the lower limit of the operable voltage range.

The communication controller is configured to determine that there is a fixedly closed malfunction in the shutoff switch when determining that the diagnostic voltage is equal to or higher than the lower limit of the output voltage range.

In the first exemplary aspect, when the shutoff switch provided on the power supply path is turned on, the voltage is supplied from the power source to the communication controller. This causes the voltage supplied from the power source to the communication controller to be equal to or higher than the lower limit of the operable voltage range of the communication controller. This results in the communication controller enabling communications between the first and second external devices. In contrast, when the shutoff switch is turned off, power supply from the power source to the communication controller is disabled. This causes the voltage supplied from the power source to the communication controller to be lower than the lower limit of the operable voltage range of the communication controller. This results in the communication controller disabling communications between the first and second external devices.

In the first exemplary aspect, the capacitor is connected to the point of the power supply path; the point is located between the shutoff switch and the communication controller. The capacitor is charged based on the voltage supplied from the voltage source while the shutoff switch is in the on state. The capacitor is configured to supply the operating voltage to the communication controller while the shutoff switch is in the off state.

That is, the capacitor enables the communication controller to operate based on the operating voltage even if the shutoff switch is temporarily opened so that power supply from the power source to the communication circuit is interrupted.

In particular, the communication controller detects the voltage across the capacitor as the diagnostic voltage, and outputs the turn-off command to the shutoff switch for turning off the shutoff switch to performs the diagnostic task that determines whether there is a fixedly closed malfunction in the shutoff switch based on determination of whether the diagnostic voltage is lower than they lower limit of the output voltage range while outputting the turn-off command to the shutoff switch.

If there is no fixedly closed malfunction in the shutoff switch, the diagnostic voltage across the capacitor gradually decreases to be lower than the lower limit of the output voltage range. This enables the communication controller to determine that there is no fixedly closed malfunction in the shutoff switch, thus outputting the turn-on command to the shutoff switch for turning on the shutoff switch while the diagnostic voltage is within the range from the lower limit of the output voltage range and the lower limit of the operable voltage range.

Otherwise if there is a fixedly closed malfunction in the shutoff switch, the diagnostic voltage across the capacitor is kept unchanged. This enables the communication controller to determine that there is a fixedly closed malfunction in the shutoff switch.

In particular, while the shutoff switch is in the off state, the capacitor is configured to supply the operating voltage to the communication controller. This enables the communication controller to perform the diagnostic task while maintaining communications between the first and second external devices. This prevents communications between the first and second external devices from being shut off for each execution of the diagnostic task. This maintains the operating efficiency of each of the first and second external devices with a higher level.

In a second exemplary aspect of the present disclosure, the communication controller is configured to output the turn-off command to the shutoff switch for a predetermined reference period. The reference period is defined such that, if the shutoff switch is turned off by the turn-off command, the diagnostic voltage is estimated to have decreased down to a predetermined reference voltage when the reference period has elapsed since the turn-off of the shutoff switch. The predetermined reference voltage is set to be lower than the lower limit of the output voltage range and to be equal to or higher than the lower limit of the operable voltage range. The communication controller is configured to determine whether the diagnostic voltage is lower than the lower limit of the output voltage range during the predetermined reference period.

In the second exemplary aspect, if there is no fixedly closed malfunction in the shutoff switch, the diagnostic voltage across the capacitor decreases to be lower than the lower limit of the output voltage range until the predetermined reference period has elapsed since the output of the turn-off command to the shutoff switch.

Otherwise, if there is a fixedly closed malfunction in the shutoff switch, the diagnostic voltage across the capacitor is kept unchanged even if the predetermined reference period has elapsed since the output of the turn-off command to the shutoff switch.

In a third exemplary aspect of the present disclosure, the communication controller is configured to output the turn-on command to the shutoff switch when the diagnostic voltage has dropped to a predetermined reference voltage since the output of the turn-off command to the shutoff switch, the predetermined reference voltage being set to be lower than the lower limit of the output voltage range and to be equal to or higher than the lower limit of the operable voltage range.

This configuration reliably prevents the voltage supplied to the communication controller from becoming to be lower than the lower limit of the operable voltage range.

In a fourth exemplary aspect of the present disclosure, the communication controller is configured to 1. Perform a communication task associated with communications between the first external device and the second external device 2. Alternately output the turn-on command to the shutoff switch for turning on the shutoff switch and the turn-off command to the shutoff switch for turning off the shutoff switch 3. Perform the diagnostic task while outputting each of the turn-off commands to the shutoff switch 4. Perform the communication task while outputting each of the turn-on commands to the shutoff switch.

This configuration of the fourth exemplary aspect enables the communication controller to alternately perform the diagnostic task while outputting each of the turn-off commands to the shutoff switch, and the communication task while outputting each of the turn-on commands to the shutoff switch. This therefore reduces time during which no communication task is performed.

In a fifth exemplary aspect of the present disclosure based on the fourth exemplary aspect, the first external device is a programmable logic controller configured to output various operation commands to a controlled target device, and the second external device is a safety device configured to output an emergency stop signal to the communication controller. The communication controller is configured to perform the communication task that sends the emergency stop signal to the programmable logic controller when the emergency stop signal is input thereto from the safety device. The programmable logic controller is configured to output an emergency stop command to the controlled target device, thus forcibly shutting down the controlled target device.

This configuration of the fifth exemplary aspect enables the communication controller to alternately perform the diagnostic task while outputting each of the turn-off commands to the shutoff switch, and the communication task while outputting each of the turn-on commands to the shutoff switch. The communication task sends the emergency stop signal to the programmable logic controller when the emergency stop signal is input thereto from the safety device. Then, the programmable logic controller is configured to output the emergency stop command to the controlled target device, thus forcibly shutting down the controlled target device. This configuration therefore ensures the safety of operators working around the controlled target device while diagnosing whether there is a fixedly closed malfunction in the shutoff switch.

In a sixth exemplary aspect of the present disclosure, the first external device is a programmable logic controller configured to output various operation commands to a controlled target device. When the communication controller shuts off communications between the programmable logic controller and the second external device, the programmable logic controller is configured to output an emergency stop command to the controlled target device, thus forcibly shutting down the controlled target device.

If there is no fixedly closed malfunction in the shutoff switch, the communication controller outputs the turn-on command to the shutoff switch for turning on the shutoff switch while the diagnostic voltage is within the range from the lower limit of the output voltage range and the lower limit of the operable voltage range. This therefore prevents instability in the programmable logic controller when the voltage supplied to the communication controller is lower than the lower limit of the operable voltage range of the communication controller.

According to a seventh exemplary aspect of the present disclosure, there is provided an I/O module to which a first external device and a second external device are connected. The I/O module includes a communication controller connected via a power supply path to a voltage source that has a predetermined output voltage range. The communication controller has an operable voltage range, and is configured to enable communications between the first external device and the second external device upon a voltage supplied from the voltage source being equal to or higher than a lower limit of the operable voltage range. The communication controller is configured to disable communications between the first external device and the second external device upon the voltage supplied from the voltage source being lower than the lower limit of the operable voltage range. The I/O module includes a shutoff switch provided on the power supply path, and a capacitor connected to a point of the power supply path; the point is located between the shutoff switch and the communication controller. The capacitor is charged based on the voltage supplied from the voltage source while the shutoff switch is in an on state. The capacitor is configured to supply an operating voltage to the communication controller while the shutoff switch is in an off state. The communication controller is configured to detect a voltage across the capacitor as a diagnostic voltage, and output a turn-off command to the shutoff switch for turning off the shutoff switch to perform a diagnostic task that determines whether there is a fixedly closed malfunction in the shutoff switch based on determination of whether an amount of drop of the diagnostic voltage per unit time is greater than a predetermined threshold amount while outputting the turn-off command to the shutoff switch. The communication controller is configured to determine that there is no fixedly closed malfunction in the shutoff switch when determining that the amount of drop of the diagnostic voltage per unit time is greater than the predetermined threshold amount. The communication controller is configured to determine that there is a fixedly closed malfunction in the shutoff switch when determining that the amount of drop of the diagnostic voltage per unit time is equal to or smaller than the predetermined threshold amount. The unit time is determined such that, if the shutoff switch is turned off in response to the turn-off command, the diagnostic voltage is maintained to be equal to or higher than the lower limit of the operable voltage range after the unit time has elapsed since the turn-off of the shutoff switch.

In the seventh exemplary aspect, when the shutoff switch provided on the power supply path is turned on, the voltage is supplied from the power source to the communication controller. This causes the voltage supplied from the power source to the communication controller to be equal to or higher than the lower limit of the operable voltage range of the communication controller. This results in the communication controller enabling communications between the first and second external devices. In contrast, when the shutoff switch is turned off, power supply from the power source to the communication controller is disabled. This causes the voltage supplied from the power source to the communication controller to be lower than the lower limit of the operable voltage range of the communication controller. This results in the communication controller disabling communications between the first and second external devices.

In the sixth exemplary aspect, the capacitor is connected to the point of the power supply path; the point is located between the shutoff switch and the communication controller. The capacitor is charged based on the voltage supplied from the voltage source while the shutoff switch is in the on state. The capacitor is configured to supply the operating voltage to the communication controller while the shutoff switch is in the off state.

That is, the capacitor enables the communication controller to operate based on the operating voltage even if the shutoff switch is temporarily opened so that power supply from the power source to the communication circuit is interrupted.

In particular, the communication controller detects the voltage across the capacitor as the diagnostic voltage, and outputs the turn-off command to the shutoff switch for turning off the shutoff switch to performs the diagnostic task that determines whether there is a fixedly closed malfunction in the shutoff switch based on determination of whether the diagnostic voltage is lower than they lower limit of the output voltage range while outputting the turn-off command to the shutoff switch.

If there is no fixedly closed malfunction in the shutoff switch, the diagnostic voltage across the capacitor rapidly decreases immediately after the turn-on of the shutoff switch, and thereafter, the rate of decrease of the diagnostic voltage becomes lower over time. There is little possibility of such a rapid decrease of the diagnostic voltage across the capacitor naturally occurring.

That is, the communication controller is configured to determine that there is no fixedly closed malfunction in the shutoff switch when determining that the amount of drop of the diagnostic voltage per unit time is greater than the predetermined threshold amount. Otherwise, the communication controller is configured to deter mine that there is a fixedly closed malfunction in the shutoff switch when determining that the amount of drop of the diagnostic voltage per unit time is equal to or smaller than the predetermined threshold amount.

In addition, in the seventh aspect, the unit time is determined such that, if the shutoff switch is turned off in response to the turn-off command, the diagnostic voltage is maintained to be equal to or higher than the lower limit of the operable voltage range after the unit time has elapsed since the turn-off of the shutoff switch. For this reason, it is possible to prevent the diagnostic voltage from decreasing to be lower than the lower limit of the output voltage range during the unit time for which the shutoff switch is turned on.

This enables the communication controller to perform the diagnostic task while maintaining communications between the first and second external devices. This prevents communications between the first and second external devices from being shut off for each execution of the diagnostic task. This maintains the operating efficiency of each of the first and second external devices with a higher level.

In an eighth aspect of the present disclosure, the first external device is a programmable logic controller configured to output various operation commands to a controlled target device. When the communication controller shuts off communications between the programmable logic controller and the second external device, the programmable logic controller is configured to output an emergency stop command to the controlled target device, thus forcibly shutting down the controlled target device.

If there is no fixedly closed malfunction in the shutoff switch, the communication controller outputs the turn-on command to the shutoff switch for turning on the shutoff switch while the diagnostic voltage is equal to or higher than the lower limit of the operable voltage range. This therefore prevents the programmable logic controller from unstably working when the voltage supplied to the communication controller is lower than the lower limit of the operable voltage range of the communication controller.

According to a ninth exemplary aspect of the present disclosure, there is provided an I/O module to which a first external device and a second external device are connected. The I/O module includes a communication controller configured to enable communications between the first external device and the second external device upon a voltage being supplied from a power source thereto, and a shutoff switch configured to shut off supply of the voltage to the communication controller when turned off. The I/O module includes a capacitor configured to be charged based on the voltage supplied from the voltage source while the shutoff switch is in an on state. The capacitor is configured to supply an operating voltage to the communication controller while the shutoff switch is turned off. The communication controller is configured to detect a voltage across the capacitor as a diagnostic voltage, and output a turn-off command to the shutoff switch for turning off the shutoff switch. The communication controller is configured to determine whether there is a fixedly closed malfunction in the shutoff switch based on change of the diagnostic voltage while outputting the turn-off command to the shut-off switch.

This configuration enables the communication controller to determine whether there is a fixedly closed malfunction in the shutoff switch while maintaining communications between the first and second external devices based on the operating voltage supplied from the capacitor. This prevents communications between the first and second external devices from being shut off for each execution of the diagnostic task. This maintains the operating efficiency of each of the first and second external devices with a higher level.

BRIEF DESCRIPTION OF THE DRAWINGS

Other aspects of the present disclosure will become apparent from the following description of embodiments with reference to the accompanying drawings in which:

FIG. 1 is a block diagram schematically illustrating a robot system according to a first embodiment of the present disclosure;

FIG. 2 is a flowchart schematically illustrating a diagnostic control task carried out by a micro controller unit (MCU) illustrated in FIG. 1;

FIGS. 4A and 4B are a joint timing chart schematically illustrating how the diagnostic voltage and the state of the shutoff switch are changed during execution of the diagnostic control task if the shutoff switch is fixedly-closed malfunctioned;

FIG. 5 is a flowchart schematically illustrating a diagnostic control task carried out by the MCU according to the second embodiment of the present disclosure;

FIGS. 6A to 6C are a joint timing chart schematically illustrating how a diagnostic voltage, the state of the shutoff switch, and the task of the MCU are changed during execution of the diagnostic control task if the shutoff switch is operating normally according to the second embodiment;

DETAILED DESCRIPTION OF EMBODIMENT

Figure 3A:
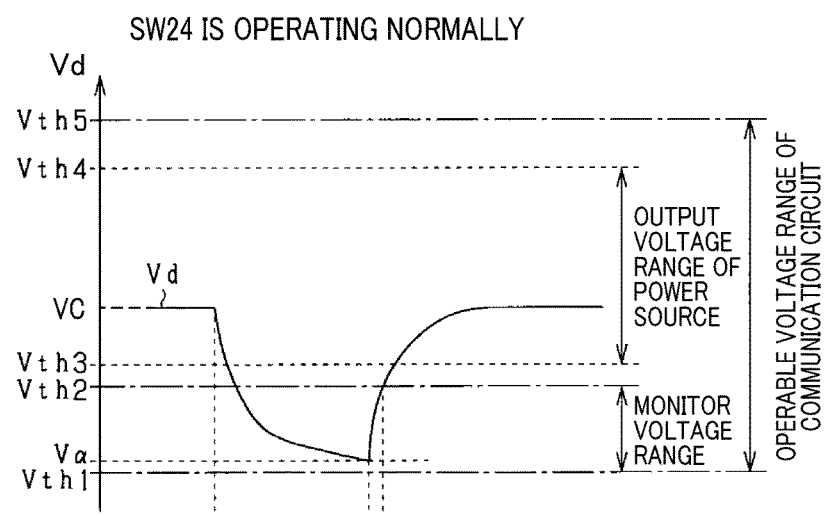
FIGS. 3A and 3B are a joint timing chart schematically illustrating how a diagnostic voltage and the state of a shutoff switch are changed during execution of the diagnostic control task if the shutoff switch is normal.

The following describes embodiments of the present disclosure with reference to the accompanying drawings. In the embodiments, like parts between the embodiments, to which like reference characters are assigned, are omitted or simplified to avoid redundant description.

First Embodiment

The following describes the first embodiment of the present disclosure with reference to FIGS. 1 to 4. An industrial robot system 1 including an I/O module 20 according to the first embodiment is used in, for example, assembly systems installed in, for example, machine assembly factories.

Referring to FIG. 1, the robot system 1 includes the I/O module 20, a programmable logic controller 100, an emergency stop switch 110 as an example of a safety device, a controller 120, and a robot 130. The programmable logic controller 100 serves as, for example, a first external device, and the emergency stop switch 110 serves as, for example, a second external device.

The programmable logic controller 100 is connected to the controller 120 via cables, and the controller 120 is connected to the robot 130 via cables. The programmable logic controller 100 is operative to output, to the controller 120, various operation commands for the robot 130 in accordance with programs stored therein. The controller 120 is operative to control the operations of the robot 130 in accordance with the operation commands. For example, a vertical six-axis articulated robot or a horizontal articulated robot can be used as the robot 130. An unillustrated higher-order controller is also connected to the programmable logic controller 100.

The I/O module 20 is connected to each of the programmable logic controller 100 and the emergency stop switch 110 via a communication line, such as a local-area network (LAN) cable. That is, the I/O module 20 according to the first embodiment serves as a remote I/O module enabling communications between the programmable logic controller 100 and the emergency stop switch 110 therethrough.

The emergency stop switch 110 is configured as, for example, a push-button switch, and outputs an emergency stop signal to the I/O module 20 when pushed by an operator. In other words, the emergency stop switch 110 is configured not to output the emergency stop signal to the I/O module 20 unless pushed by an operator.

The I/O module 20 includes a micro controller unit (MCU) 21, a communication circuit 22, a constant-voltage power source 23, a shutoff switch 24, and a capacitor 25. The MCU 21 and the communication circuit 22 serve as, for example, a communication controller according to the first embodiment.

The shutoff switch 24 has opposing first and second ends. The constant-voltage power source 23 is connected to the MCU 21 and to the first end of the shutoff switch 24. The second end of the shutoff switch 24 is connected to the communication circuit 22 via a power supply path 26, and also to the MCU 21 via a voltage monitor path 27. The voltage monitor path 27 is connected to a point PO on the power supply path 26; the point PO is located between the shutoff switch 24 and the communication circuit 22.

The capacitor 25 includes opposing first and second electrodes. The first electrode is connected to the voltage monitor path 27, and the second electrode is connected to a common signal ground of the I/O module 20. That is, the MCU 21 and the communication circuit 22 are connected to the common signal ground.

The MCU 21 is configured to operate based on constant output power, i.e. a constant output voltage, always supplied from the constant-voltage power source 23.

For example, an N-channel MOSFET is used as the shutoff switch 24. The MCU 21 is connected to a control terminal, such as the gate, of the shutoff switch 24. That is, the drain of the shutoff switch 24 corresponds to the first terminal connected to the constant-voltage power source 23, and the source of the shutoff switch 24 corresponds to, for example, the second terminal connected to the communication circuit 22 via the power supply path 26.

The MCU 21 is capable of outputting a turn-on command, i.e. an opening command, or a turn-off command, i.e. a closing command, to the control terminal of the shutoff switch 24 for turning on or turning off the shutoff switch 24.

The shutoff switch 24 is in an on state in a normal operation mode. This enables the output power, i.e. output voltage VC, to be supplied from the constant-voltage power source 23 to the communication circuit 22 via the shutoff switch 24 and the power supply path 26. This enables the communication circuit 22 to operate based on the output voltage VC, enabling the programmable logic controller 100 and the emergency stop switch 110 to communicate with each other. Note that the communication circuit 22 has an operable voltage range between a first threshold voltage, i.e. a lower limit, Vth1 and a fifth threshold voltage, i.e. an upper limit, Vth5 inclusive; the fifth threshold voltage Vth5 is set to be higher than the first threshold voltage Vth5. The output voltage VC of the constant-voltage power source 23 is previously set within a predetermined output voltage range between a third threshold voltage Vth3 and a fourth threshold voltage Vth4 inclusive; the third threshold voltage Vth3 is set to be higher than the first threshold voltage Vth1, the fourth threshold voltage Vth4 is set to be higher than the third threshold voltage Vth3, and the fourth threshold voltage Vth4 is set to be lower than the fifth threshold voltage Vth5.

When receiving the emergency stop signal sent from the emergency stop switch 110 in response to an operator's pushing down of the emergency stop switch 110, the MCU 21 outputs the turn-off command to the control terminal of the shutoff switch 24. The shutoff switch 24 is turned off based on the turn-off command, so that the power supply from the constant-voltage power source 23 to the communication circuit 22 is shut off. This shutoff of the communication circuit 22 interrupts communications between the programmable logic controller 100 and the emergency stop switch 110. In response to the interruption, the programmable logic controller 100 outputs an emergency stop command for forcibly shutting down the robot 130 to the controller 120, and the controller 120 forcibly shuts down the robot 130.

Additionally, while the shutoff switch 24 is in the on state, the output voltage VC of the constant-voltage power source 23 is supplied to the capacitor 25 via the voltage monitor path 27, so that the capacitor 25 is charged based on the output voltage VC. That is, the capacitor 25 is charged to have the level equal to the output voltage VC while the shutoff switch 24 is in the on state.

The MCU 21 is configured to monitor a voltage across the capacitor 25 via the voltage monitor path 27 as a diagnostic voltage Vd, and to perform a diagnostic control task including a self-diagnostic task based on at least one of the diagnostic voltage Vd and a predetermined monitor voltage range each time a predetermined diagnostic condition is satisfied. The monitor voltage range is previously determined as a voltage range between the first threshold voltage Vth1 inclusive and a second threshold voltage Vth2 exclusive; the second threshold voltage Vth2 is set to be lower than the third threshold voltage Vth3. Note that the relationship of the first to fifth threshold voltages Vth1 to Vth5 is therefore defined as the following relation:

$$Vth1 < Vth2 < Vth3 < Vth4 < Vth5$$

The self-diagnostic task is designed to diagnose whether there is a fixedly-closed malfunction in the shutoff switch 24 in accordance with the diagnostic voltage Vd and the monitor voltage range. The fixedly-closed malfunction in the shutoff switch 24 is defined as a malfunction in which the shutoff switch 24 is fixedly closed independently of control of the MCU 21.

The MCU 21 according to the first embodiment is configured to cyclically perform the diagnostic control task including the self-diagnostic task with reference to FIG. 2. That is, the diagnostic condition is defined such that the MCU 21 performs the current cycle of the diagnostic control task at a time when the predetermined time interval has elapsed since completion of the previous cycle of the diagnostic control task. Note that the capacitor 25 has been charged so that the voltage, i.e. the diagnostic voltage Vd, across the capacitor 25 has reached to be equal to the output voltage VC output from the constant-voltage power source 23.

When starting the current cycle of the diagnostic control task, the MCU 21 outputs the turn-off command to the control terminal of the shutoff switch 24 for a predetermined period, thus starting the self-diagnostic task for the shutoff switch 24 in step S1.

Note that the MCU 21 according to the first embodiment performs a task of monitoring whether the emergency stop switch 110 is pushed down for the predetermined period in parallel with the self-diagnostic task.

Specifically, the MCU 21 determines whether the shutoff switch 24 is operating normally based on at least the diagnostic voltage Vd in step S2.

For example, the MCU 21 determines whether the diagnostic voltage Vd is changed, and determines whether the shutoff switch 24 is operating normally based on whether the diagnostic voltage Vd is changed.

More specifically, the MCU 21 determines whether the diagnostic voltage Vd across the capacitor 25 has dropped to be within a predetermined monitor voltage range from the first threshold voltage, i.e. a lower limit, Vth1 inclusive to the second threshold voltage, i.e. an upper limit, Vth2 exclusive in step S2A.

Upon determining that the diagnostic voltage Vd across the capacitor 25 has dropped to be within the voltage monitor range (YES in step S2A), the MCU 1 determines that the shutoff switch 24 is operating normally, i.e. determines that there is no fixedly-closed malfunction in the shutoff switch 24 (YES in step S2), then turning on the shutoff switch 24 in step S3.

Otherwise, upon determining that diagnostic voltage Vd across the capacitor 25 has not dropped to be within the voltage monitor range (NO in step S2A), the MCU 21 determines that the shutoff switch 24 is operating abnormally, i.e. determines that there is a fixedly-closed malfunction in the shutoff switch 24 (NO in step S2). Then, the MCU 21 instructs the communication circuit 12 to shut off the communications between the programmable logic controller 100 and the emergency stop switch 110 in step S4.

The shutoff operation of the communication circuit 12 causes the programmable logic controller 100 to output the emergency stop command for forcibly shutting down the robot 130 to the controller 120, and the controller 120 forcibly shuts down the robot 130.

Figure 3B:
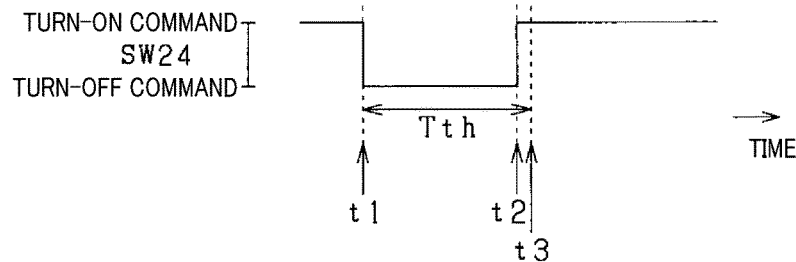

Next, the following describes how the diagnostic voltage Vd across the capacitor 25 is changed and how the state of the shutoff switch (SW) 24 is changed during execution of the diagnostic control task while there is no fixedly-closed malfunction in the shutoff switch 25, i.e. the shutoff switch 24 is normal, first (see FIGS. 3A and 3B).

FIG. 3A shows the first to fifth threshold voltages Vth1 to Vth5. As described above, the operable voltage range of the communication circuit 22 is defined as the voltage range between the first threshold voltage Vth1 and the fifth threshold voltage Vth5 inclusive.

When the output voltage VC supplied from the constant-voltage power source 23 to the communication circuit 22 is within the operable voltage range of the communication circuit 22, the communication circuit 22 enables the programmable logic controller 100 and the emergency stop switch 110 to communicate with each other.

In addition, when the shutoff switch 24 is in an open state, i.e. the off state, voltage supply from the constant-voltage power source 23 to the communication circuit 22 is shut off, the diagnostic voltage Vd across the capacitor 25 enables the communication circuit 22 to continuously operate. As a result, the communication circuit 22 continuously enables the programmable logic controller 100 and the emergency stop switch 110 to communicate with each other. The diagnostic voltage Vd however decreases over time, and therefore, when the diagnostic voltage Vd becomes lower than the first threshold voltage Vth1 serving as the lower limit of the operable voltage range of the communication circuit 22, communications between the programmable logic controller 100 and the emergency stop switch 110 are shut off.

As described above, the output voltage VC of the constant-voltage power source 23 is set within the output voltage range between the third threshold voltage Vth3 and the fourth threshold voltage Vth4 inclusive. That is, the lower limit Vth3 of the output voltage range of the constant-voltage power source 23 is set to be higher than the lower limit Vth1 of the operable voltage range of the communication circuit 22. The reason why the output voltage VC of the constant-voltage power source 23 is within the output voltage range between the third threshold voltage Vth3 and the fourth threshold voltage Vth4 inclusive in spite of the constant-voltage power source 23 is that the output voltage VC of the constant-voltage power source 23 has a tolerance relative to a designed voltage. The reason why the output voltage VC of the constant-voltage power source 23 has a tolerance relative to a designed voltage is that there is individual variability between the output voltages VC of constant-voltage power sources, one of which is used as the constant-voltage power source 23.

Referring to FIGS. 3A and 3B, the turn-off command is continuously output from the MCU 21 to the control terminal of the shutoff switch 24 from time t1 to one of the predetermined first timing and the predetermined second timing (see step S1). The time interval from the time t1 to one of the first timing and the second timing represents the predetermined period in step S1.

The first timing is a timing t3 when a predetermined reference period Tth has elapsed since the turn-off command output timing to the shutoff switch 24 in step S1. The reference period Tth is defined such that, if the shutoff switch 24 is off, i.e. opened, at the time t1, the diagnostic voltage Vd is estimated to have decreased down to a predetermined reference voltage Vα when the reference period Tth has elapsed since the time t1; the predetermined reference voltage Vα is set to be lower than the lower limit Vth3 of the output voltage range and to be equal to or higher than the lower limit Vth2 of the monitor voltage range.

In particular, the reference period Tth is set to a maximum value in a predetermined time range from the turn-off command output timing t1; when any time in the predetermined time range has elapsed since the turn-off command output timing t1, the diagnostic voltage Vd has reliably decreased down to the predetermined reference voltage Vα since the turn-off command output timing t1. For example, the reference period Tth is set to a value selected from the range from tens of microseconds to hundreds of microseconds inclusive.

The second timing is the timing when the diagnostic voltage Vd has decreased down to the reference voltage Vα since the turn-off command output timing t1.

FIGS. 3A and 3B illustrate that, because the shutoff switch 24 is turned off, i.e. opened, normally in response to the turn-off command, the diagnostic voltage Vd across the capacitor 25 has decreased down to the reference voltage Vα at time t2 corresponding to the second timing before the reference period Tth has elapsed since the time t1.

For this reason, the MCU 21 determines that the diagnostic voltage Vd across the capacitor 25 has dropped to be within the monitor voltage range from the first threshold voltage Vth1 inclusive to the second threshold voltage Vth2 exclusive, thus determining that there is no fixedly-closed malfunction in the shutoff switch 24 (see YES in step S2). Then, the MCU 21 turns on the shutoff switch S3 at the time t2 (see step S3).

In particular, the I/O module 20 according to the first embodiment includes the capacitor 25 that supplies the diagnostic voltage Vd charged therein to the communication circuit 22 even if the shutoff switch 24 is temporarily turned off, i.e. opened, for diagnose of the shutoff switch 24. This prevents the diagnostic voltage Vd supplied to the communication circuit 22 from rapidly decreasing down to the lower limit Vth1 of the operable voltage range. This therefore ensures sufficient time to temporarily turn off the shutoff switch 24 while enabling communications between the programmable controller 100 and the emergency stop switch 110.

Next, the following describes how the diagnostic voltage Vd across the capacitor 25 is changed and how the state of the shutoff switch 24 is changed during execution of the diagnostic control task while there is a fixedly-closed malfunction in the shutoff switch 25 first (see FIGS. 4A and 4B).

Referring to FIGS. 4A and 4B, even if the turn-off command is continuously output from the MCU 21 to the control terminal of the shutoff switch 24 for the reference period Tth from the time t1 to the first timing corresponding to the time t3, the shutoff switch 24 is not turned off, i.e. opened, so that the diagnostic voltage Vd is maintained at the output voltage VC of the constant-voltage power source 23. This results in the MCU 21 determining that the diagnostic voltage Vd across the capacitor 25 having not dropped to be within the voltage monitor range, thus determining that there is a fixedly-closed malfunction in the shutoff switch 24 (NO in step S2). Then, the MCU 21 instructs the communication circuit 12 to shut off communications between the programmable logic controller 100 and the emergency stop switch 110 (see in step S4). This causes the communication circuit 12 to shut off communications between the programmable logic controller 100 and the emergency stop switch 110. This results in the programmable logic controller 100 outputting the emergency stop command for forcibly shutting down the robot 130 to the controller 120, and the controller 120 forcibly shuts down the robot 130. This reliably stops operations of the robot 130 if there is a fixedly-closed malfunction in the shutoff switch 24.

As described above, the MCU 21 of the I/O module 20 according to the first embodiment is configured to (1) Perform the self-diagnostic task to open, i.e. turn off, the shutoff switch 24 while continuously supplying electrical power to the communication circuit 22

(2) Determine whether the diagnostic voltage Vd has decreased to be within the monitor voltage range (3) Close, i.e. turn on, the shutoff switch 24 when it is determined that the diagnostic voltage Vd has decreased to be within the monitor voltage range (4) Determine that there is a fixedly-closed malfunction in the shutoff switch 24 when it is determined that the diagnostic voltage Vd has not decreased to be within the monitor voltage range This configuration enables the self-diagnostic task to be carried out while maintaining communications between the programmable logic controller 100 and the emergency stop switch 110. In other words, this configuration prevents power supply from being stopped to the communication circuit 22 for each execution of the self-diagnostic task, to thereby prevent communications between the programmable logic controller 100 and the emergency stop switch 110 from being shut off for each execution of the self-diagnostic task. This maintains the operating efficiency of each of the programmable logic controller 100 and the emergency stop switch 110 with a higher level.

Second Embodiment

The following describes the second embodiment of the present disclosure with reference to FIGS. 5 and 6. An industrial robot system according to the second embodiment differs from the industrial robot system 1 in the following points. So, the following mainly describes the different points of the industrial robot system according to the second embodiment, and omits or simplifies descriptions of like parts between the first and second embodiments, to which identical or like reference characters are assigned, thus eliminating redundant description.

The MCU 21 of the industrial robot system is configured to cyclically perform a diagnostic control task with reference to FIG. 5, which is different from the diagnostic control task illustrated in FIG. 2.

When starting the current cycle of the diagnostic control task, the MCU 21 repeatedly outputs the turn-off command to the control terminal of the shutoff switch 24 at intervals, such as regular intervals, thus starting the self-diagnostic task for the shutoff switch 24 in step S11. In other words, the MCU 21 alternately outputs the turn-on command and the turn-off command to the control terminal of the shutoff switch 24 for alternately turning on and turning off the shutoff switch 24.

That is, while outputting the turn-off command to the shutoff switch 24, the MCU 21 performs the operations in step S2, and the operation S3 or S4 without performing the task of monitoring whether the emergency stop switch 110 is pushed down in step S11.

While MCU 21 does not output the turn-off command to the shutoff switch 24 for each interval, i.e. outputs the turn-on command to the shutoff switch 24 for each interval, the MCU 21 performs the task of monitoring whether the emergency stop switch 110 is pushed down in step S12.

Next, the following describes, while there is no fixedly-closed malfunction in the shutoff switch 25, (1) How the diagnostic voltage Vd across the capacitor 25 is changed (2) How the state of the shutoff switch 24 is changed during execution of the diagnostic control task (3) How the self-diagnostic task and the monitoring task are performed by the MCU 21 (see FIGS. 6A and 6B)

As described above, the MCU 21 according to the first embodiment executes the self-diagnostic task to output the turn-off command to the control terminal of the shutoff switch 24 for the predetermined period to diagnose whether there is a fixedly-closed malfunction in the shutoff switch 24 while executing the task of monitoring whether the emergency stop switch 110 is pushed down.

The first embodiment therefore requires a considerable amount of processing load of the MCU 21. If the MCU 21 is configured not to perform the monitoring task while performing the self-diagnostic task although this configuration reduces the processing load of the MCU 21, this configuration increases the period for which the MCU 21 cannot check whether the emergency stop switch 110 has been operated by an operator.

In view of these circumstances, the MCU 21 according to the second embodiment is configured to (1) Execute the self-diagnostic task to output the turn-off command to the control terminal of the shutoff switch 24 for determining whether there is a fixedly-closed malfunction in the shutoff switch 24 at intervals (see reference character Tv in FIGS. 3A to 3C)

(2) Execute the task of monitoring whether the emergency stop switch 110 is pushed down for each of the intervals Tv during which the MCU 21 outputs the turn-on command to the shutoff switch 24

Specifically, referring to FIGS. 6A and 6B, the turn-off command is output from the MCU 21 to the control terminal of the shutoff switch 24 from time t11 for a predetermined short period Tp (see step S10). During the period Tp, the MCU 21 executes the self-diagnostic task for diagnosing whether there is a fixedly-closed malfunction in the shutoff switch 24 without executing the task of monitoring whether the emergency stop switch 110 is pushed down (see step S11).

In contrast, after the period Tp has elapsed since the time t11, the MCU 21 outputs the turn-on command to the control terminal of the shutoff switch 24 at time t12, and executes, from the time t12, the task of monitoring whether the emergency stop switch 110 is pushed down during the interval Tv for which the MCU 21 does not execute the fixedly-closed state diagnosing task (see step S12). The interval Tv is expressed from the time t12 to time t13. That is, as illustrated in FIG. 6C, the MCU 21 executes (1) The self-diagnostic task for each of the period Tp from the time t11 to the time t12, the period Tp from the time t13 to time t14, and the period Tp from time t15 to time t16

(2) The task of monitoring whether the emergency stop switch 110 is pushed down for each of the interval Tv from the time t12 to the time t13 and the interval Tv from the time t14 to the time t15

As described above, the MCU 21 of the I/O module 20 according to the second embodiment achieves substantially the same advantageous effects as those achieved by the I/O module 20 according to the first embodiment. This is because the basic structure of the I/O module 20 according to the second embodiment is identical to the basic structure of the I/O module 20 according to the first embodiment.

In addition, the above alternative execution of the self-diagnostic task and the task of monitoring whether the emergency stop switch 110 is pushed down according to the second embodiment enables reduction of the processing load of the MCU 21 and ensuring of the checking period for operator's operation of the emergency stop switch 110 to be efficiently balanced.

Note that the monitoring task, i.e. the task of monitoring whether the emergency stop switch 110 is pushed down, is an example of the communication task associated with communications between the emergency stop switch 110 and the programmable logic controller 100.

Third Embodiment

Figure 7:
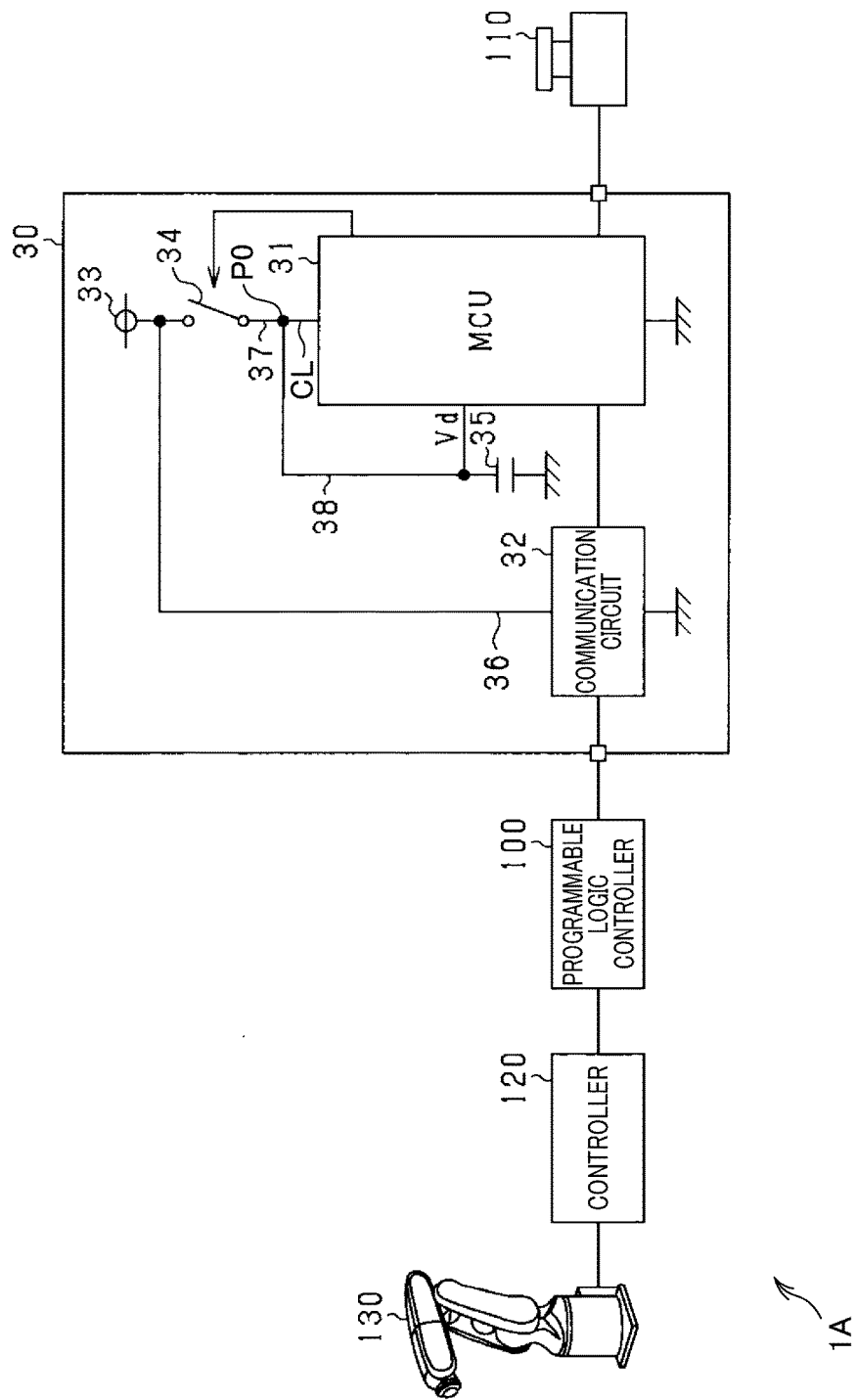
FIG. 7 is a block diagram schematically illustrating a robot system according to a third embodiment of the present disclosure.

The following describes the third embodiment of the present disclosure with reference to FIG. 7. An industrial robot system 1A according to the third embodiment differs from the industrial robot system 1 in the following points. So, the following mainly describes the different points of the industrial robot system 1A according to the third embodiment, and omits or simplifies descriptions of like parts between the first and third embodiments, to which identical or like reference characters are assigned, thus eliminating redundant description.

Referring to FIG. 7, the robot system 1A includes an I/O module 30 whose structure differs from the structure of the I/O module 20 illustrated in FIG. 1.

Specifically, the I/O module 30 includes an MCU 31, a communication circuit 32, a constant-voltage power source 33, a shutoff switch 34, and a capacitor 35. The configurations of the MCU 31, communication circuit 32, constant-voltage power source 33, shutoff switch 34, and capacitor 35 are substantially identical to the structures of the respective MCU 21, communication circuit 22, constant-voltage power source 23, shutoff switch 24, and capacitor 25 according to the first embodiment. The MCU 31 serves as, for example, a communication controller according to the third embodiment.

The communication circuit 32 and the constant-voltage source 33 are constantly connected to each other via a first power-supply path 36. This causes the communication circuit 32 to operate based on the constant output voltage always supplied from the constant-voltage power source 23.

The MCU 31 and the constant-voltage source 33 are connected to each other via a second power-supply path 37.

The shutoff switch 34 according to the third embodiment is provided on the second power-supply path 37. The control terminal of the shutoff switch 34 is connected to the MCU 31, which is similar to the first embodiment.

A connection line CL between the shutoff switch 34 and the MCU 31 on the second power-supply path 37 is connected to the MCU 31 via a voltage monitor path 38. That is, the voltage monitor path 38 is connected to a point PO on the second power-supply path 37; the point PO is located between the shutoff switch 34 and the MCU 31. The capacitor 35 is connected between the voltage monitor path 38 and the common signal ground.

The MCU 31 is capable of outputting the turn-on command or the turn-off command to the control terminal of the shutoff switch 34 for turning on or turning off the shutoff switch 34.

In particular, the shutoff switch 34 is constantly on in the normal operation mode. This enables the output power, i.e. output voltage VC, to be constantly supplied from the constant-voltage power source 33 to the MCU 31 via the shutoff switch 34 and the second power-supply path 37. This results in the MCU 31 and communication circuit 32 enabling the programmable logic controller 100 and the emergency stop switch 110 to communicate with each other.

When receiving the emergency stop signal sent from the emergency stop switch 110 in response to an operator's pushing down of the emergency stop switch 110, the MCU 31 outputs the turn-off command to the control terminal of the shutoff switch 34. The shutoff switch 34 is turned off based on the turn-off command, so that the power supply from the constant-voltage power source 33 to the MCU 31 is shut off. This shutoff of the MCU 31 interrupts communications between the programmable logic controller 100 and the emergency stop switch 110 via the communication circuits 31 and the MCU 31. In response to the interruption, the programmable logic controller 100 outputs an emergency stop command for forcibly shutting down the robot 130 to the controller 120, and the controller 120 forcibly shuts down the robot 130.

Additionally, while the shutoff switch 34 is in the on state, the output voltage VC of the constant-voltage power source 33 is supplied to the capacitor 35 via the voltage monitor path 38, so that the capacitor 35 is charged based on the output voltage VC. That is, the capacitor 35 is charged to have the level equal to the output voltage VC while the shutoff switch 34 is in the on state.

The MCU 31 is configured to monitor the voltage across the capacitor 35 via the voltage monitor path 38 as the diagnostic voltage Vd, and to perform the diagnostic control task including the self-diagnostic task based on the diagnostic voltage Vd and the predetermined monitor voltage range each time a predetermined diagnostic condition is satisfied.

The self-diagnostic task is designed to diagnose whether there is a fixedly-closed malfunction in the shutoff switch 34 in accordance with the diagnostic voltage Vd and the monitor voltage range.

Like the first embodiment, the MCU 31 according to the third embodiment is configured to cyclically perform the diagnostic control task including the self-diagnostic task with reference to FIG. 2.

In particular, the operable voltage range of the communication circuit 22 illustrated in FIGS. 3A and 3B according to the first embodiment is replaced with the operable voltage range of the MCU 31 according to the third embodiment.

Specifically, when the output voltage VC supplied from the constant-voltage power source 33 to the MCU 31 is within the operable voltage range of the MCU 31, the MCU 31 enables the programmable logic controller 100 and the emergency stop switch 110 to communicate with each other.

In addition, when the shutoff switch 34 is in the open state, i.e. the off state, voltage supply from the constant-voltage power source 33 to the MCU 31 is shut off, the diagnostic voltage Vd across the capacitor 35 enables the MCU 31 to continuously operate. As a result, the MCU 31 continuously enables the programmable logic controller 100 and the emergency stop switch 110 to communicate with each other via the communication circuit 32.

As described above, the MCU 31 of the I/O module 30 according to the third embodiment is configured to (1) Perform the self-diagnostic task to open, i.e. turn off, the shutoff switch 34 while continuously supplying electrical power to the MCU 31 (see step S1)

(2) Determine whether the diagnostic voltage Vd has decreased to be within the monitor voltage range (see step S2)

(3) Close, i.e. turn on, the shutoff switch 34 when it is determined that the diagnostic voltage Vd has decreased to be within the monitor voltage range (see step S3)

(4) Determine that there is a fixedly-closed malfunction in the shutoff switch 34 when it is determined that the diagnostic voltage Vd has not decreased to be within the monitor voltage range (see step S4)

Accordingly, the MCU 31 of the I/O module 30 according to the third embodiment achieves substantially the same advantageous effects as those achieved by the I/O module 20 according to the first embodiment. This is because the basic structure of the I/O module 30 according to the third embodiment is identical to the basic structure of the I/O module 20 according to the first embodiment.

Fourth Embodiment

Figure 8:
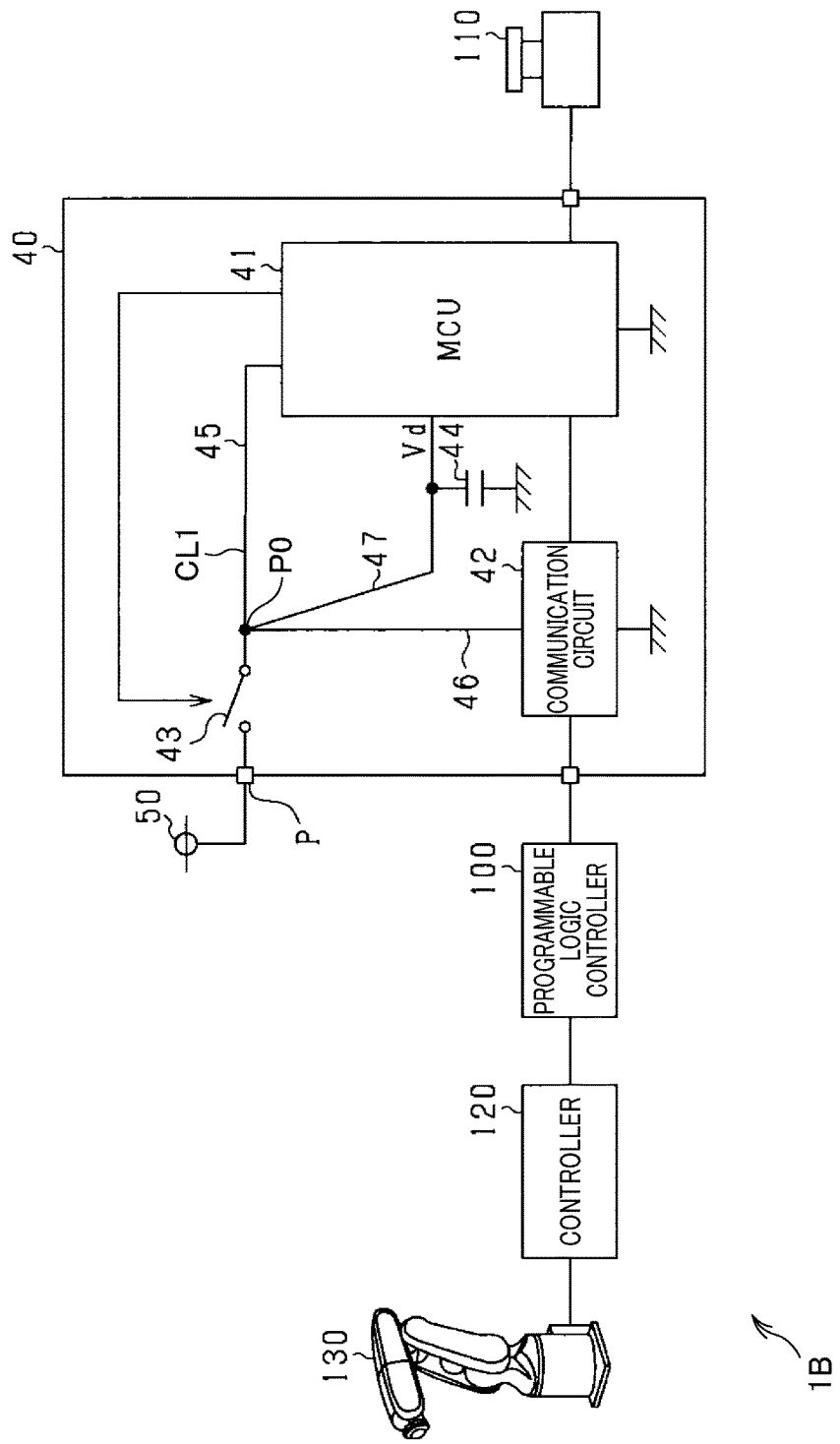
FIG. 8 is a block diagram schematically illustrating a robot system according to a fourth embodiment of the present disclosure.

The following describes the fourth embodiment of the present disclosure with reference to FIG. 8. An industrial robot system 1B according to the fourth embodiment differs from the industrial robot system 1A according to the third embodiment in the following points. So, the following mainly describes the different points of the industrial robot system 1B according to the fourth embodiment, and omits or simplifies descriptions of like parts between the third and fourth embodiments, to which identical or like reference characters are assigned, thus eliminating redundant description.

Referring to FIG. 8, the robot system 1B includes an I/O module 40 whose structure differs from the structure of the I/O module 30 illustrated in FIG. 7.

Specifically, the I/O module 40 includes an MCU 41, a communication circuit 42, a shutoff switch 43, and a capacitor 44. The configurations of the MCU 41, communication circuit 42, shutoff switch 43, and capacitor 44 are substantially identical to the structures of the respective MCU 31, communication circuit 32, shutoff switch 34, and capacitor 35 according to the third embodiment. The MCU 41 and the communication circuit 42 serve as, for example, a communication controller according to the fourth embodiment.

The I/O module 40 has a power-supply terminal P. To the power-supply terminal P, an external constant-voltage power source 50 is connected. The MCU 41 is connected to the power-supply terminal P via first power-supply path 45. The shutoff switch 43 is provided on the first power-supply path 45. The control terminal of the shutoff switch 43 is connected to the MCU 41, which is similar to the third embodiment.

To a connection line CL1 between the shutoff switch 43 and the MCU 41 on the first power-supply path 45, the communication circuit 42 is connected via a second power-supply path 46.

The connection line CL1 is also connected to the MCU 41 via a voltage monitor path 47. That is, the voltage monitor path 47 is connected to a point PO on the first power supply path 45; the point PO is located between the shutoff switch 43 and the MCU 41. The capacitor 44 is connected between the voltage monitor path 47 and the common signal ground.

The MCU 41 is capable of outputting the turn-on command or the turn-off command to the control terminal of the shutoff switch 43 for turning on or turning off the shutoff switch 43.

In particular, the shutoff switch 43 is constantly on in the normal operation mode. This enables the output power, i.e. output voltage VC, to be constantly supplied from the external constant-voltage power source 50 to each of the communication circuit 42 and the MCU 41 via the shutoff switch 43 and a corresponding one of the first power-supply path 46 and the second power-supply path 47. This results in the MCU 41 and communication circuit 42 enabling the programmable logic controller 100 and the emergency stop switch 110 to communicate with each other.

When receiving the emergency stop signal sent from the emergency stop switch 110 in response to an operator's pushing down of the emergency stop switch 110, the MCU 41 outputs the turn-off command to the control terminal of the shutoff switch 43. The shutoff switch 43 is turned off based on the turn-off command, so that the power supply from the external constant-voltage power source 50 to the MCU 41 and the communication circuit 42 is shut off. This shutoff of the MCU 41 and the communication circuit 42 interrupts communications between the programmable logic controller 100 and the emergency stop switch 110 via the communication circuits 42 and the MCU 41. In response to the interruption, the programmable logic controller 100 outputs an emergency stop command for forcibly shutting down the robot 130 to the controller 120, and the controller 120 forcibly shuts down the robot 130.

Additionally, while the shutoff switch 43 is in the on state, the output voltage VC of the external constant-voltage power source 50 is supplied to the capacitor 44 via the voltage monitor path 47, so that the capacitor 44 is charged based on the output voltage VC. That is, the capacitor 44 is charged to have the level equal to the output voltage VC while the shutoff switch 43 is in the on state.

The MCU 41 is configured to monitor the voltage across the capacitor 44 via the voltage monitor path 47 as the diagnostic voltage Vd, and to perform the diagnostic control task including the self-diagnostic task based on the diagnostic voltage Vd and the predetermined monitor voltage range each time a predetermined diagnostic condition is satisfied.

The self-diagnostic task is designed to diagnose whether there is a fixedly-closed malfunction in the shutoff switch 43 in accordance with the diagnostic voltage Vd and the monitor voltage range.

Like the third embodiment, the MCU 41 according to the fourth embodiment is configured to cyclically perform the diagnostic control task including the self-diagnostic task with reference to FIG. 2.

In particular, the MCU 41 has a first operable voltage range from a first lower limit to a first upper limit inclusive, and the communication circuit 42 has a second operable voltage range from a second lower limit to a second upper limit inclusive. The lower limit of the operable voltage range illustrated in FIGS. 3A and 3B is set to one of the first lower limit and the second lower limit; one of first lower limit and the second lower limit is higher than the other thereof. In addition, the upper limit of the operable voltage range illustrated in FIGS. 3A and 3B is set to one of the first upper limit and the second upper limit; one of first upper limit and the second upper limit is lower than the other thereof.

When the shutoff switch 43 is in the open state, i.e. the off state, voltage supply from the external constant-voltage power source 50 to the MCU 41 and the communication circuit 42 is shut off, the diagnostic voltage Vd across the capacitor 44 enables the MCU 41 to continuously operate. As a result, the MCU 41 continuously enables the programmable logic controller 100 and the emergency stop switch 110 to communicate with each other via the communication circuit 32.

As described above, the MCU 41 of the I/O module 40 according to the fourth embodiment is configured to (1) Perform the self-diagnostic task to open, i.e. turn off, the shutoff switch 43 while continuously supplying electrical power to the MCU 41 (see step S1)

(2) Determine whether the diagnostic voltage Vd has decreased to be within the monitor voltage range (see step S2)

(3) Close, i.e. turn on, the shutoff switch 43 when it is determined that the diagnostic voltage Vd has decreased to be within the monitor voltage range (see step S3)

(4) Determine that there is a fixedly-closed malfunction in the shutoff switch 43 when it is determined that the diagnostic voltage Vd has not decreased to be within the monitor voltage range (see step S4)

Accordingly, the MCU 41 of the I/O module 40 according to the fourth embodiment achieves substantially the same advantageous effects as those achieved by the I/O module 30 according to the third embodiment. This is because the basic structure of the I/O module 40 according to the fourth embodiment is identical to the basic structure of the I/O module 30 according to the third embodiment.

Modifications

The present disclosure is not limited to the above described embodiments, and can be variably modified within the scope of the present disclosure.

The upper limit of the output voltage range outputtable by the constant-voltage power source 23 according to the first embodiment can be set to be equal to or higher than the upper limit of the operational voltage range of the communication circuit 22.

The monitor voltage range used for determining whether there is a fixedly-closed malfunction in the shutoff switch 24 is not limited to the range expressed by the range from the first threshold voltage Vth1 inclusive to the second threshold voltage Vth2 exclusive, which is illustrated in FIGS. 3A and 3B.

Specifically, the lower limit of the monitor voltage range can be set to be higher than the lower limit Vth1 of the operable voltage range of the communication circuit 22.

In step S2A, the MCU 21 determines whether the diagnostic voltage Vd across the capacitor 25 has dropped to be within the monitor voltage range, but the present disclosure is not limited thereto.

Figure 9A:
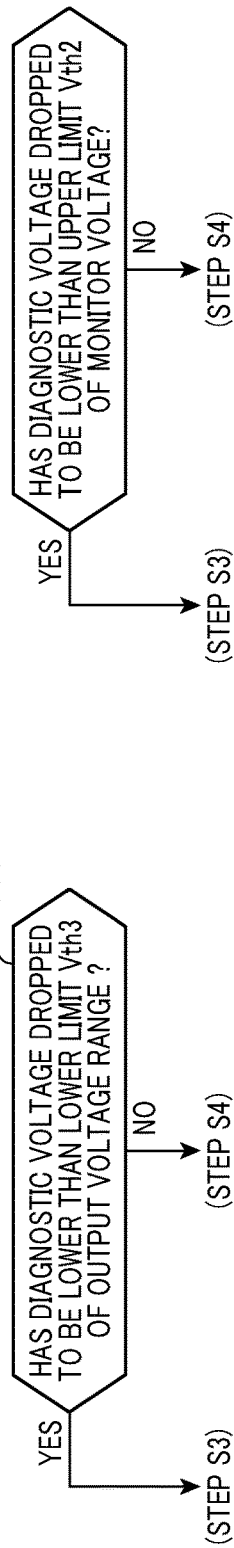
FIG. 9A is a flowchart schematically illustrating a first modification of the diagnostic control task illustrated in FIG. 2.

Specifically, the MCU 21 can determine whether the diagnostic voltage Vd across the capacitor 25 has dropped to be lower than the lower limit Vth3 of the output voltage range of the constant-voltage power source 23 in step S2B in FIG. 9A. Upon determining that the diagnostic voltage Vd across the capacitor 25 has dropped to be lower than the lower limit Vth3 (YES in step S2B), the MCU 21 determines that there is no fixedly-closed malfunction in the shutoff switch 24. Then, the MCU 21 performs the operation in step S3. Otherwise, upon determining that the diagnostic voltage Vd across the capacitor 25 has not dropped to be lower than the lower limit Vth3 (NO in step S2B), the MCU 21 determines that there is a fixedly-closed malfunctions in the shutoff switch 24. Then, the MCU 21 performs the operation in step S4.

Figure 9B:
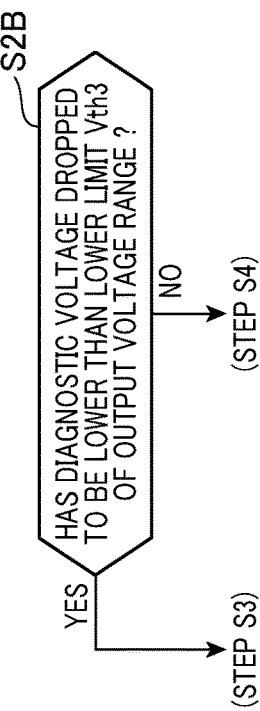
FIG. 9B is a flowchart schematically illustrating a second modification of the diagnostic control task illustrated in FIG. 2.

As another example, the MCU 21 can determine whether the diagnostic voltage Vd across the capacitor 25 has dropped to be lower than the upper limit Vth2 of the monitor voltage range defined from the first threshold voltage Vth1 inclusive to the second threshold voltage Vth2 in step S2C in FIG. 9B. Upon determining that the diagnostic voltage Vd across the capacitor 25 has dropped to be lower than the upper limit Vth2 (YES in step S2C), the MCU 21 determines that there is no fixedly-closed malfunction in the shutoff switch 24. Then, the MCU 21 performs the operation in step S3.

Otherwise, upon determining that the diagnostic voltage Vd across the capacitor 25 has not dropped to be lower than the upper limit Vth2 (NO in step S2C), the MCU 21 determines that there is a fixedly-closed malfunctions in the shutoff switch 24. Then, the MCU 21 performs the operation in step S4.

Figure 9C:
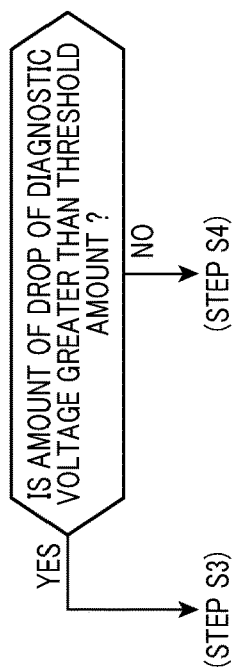
FIG. 9C is a flowchart schematically illustrating a third modification of the diagnostic control task illustrated in FIG. 2.

In addition, the MCU 21 can determine whether an amount of drop of the diagnostic voltage Vd per unit time is greater than a predetermined threshold amount in step S2D in FIG. 9C. Upon determining that the amount of drop of the diagnostic voltage Vd per unit time is greater than the predetermined threshold amount (YES in step S2D), the MCU 21 determines that there is no fixedly-closed malfunction in the shutoff switch 24. Then, the MCU 21 performs the operation in step S3.

Otherwise, upon determining that the amount of drop of the diagnostic voltage Vd per unit time is equal to or smaller than the predetermined threshold amount (NO in step S2D), the MCU 21 determines that there is a fixedly-closed malfunctions in the shutoff switch 24. Then, the MCU 21 performs the operation in step S4.

The unit time can be determined such that, if the shutoff switch 24 is turned off, i.e. opened, in response to the turn-off command, the diagnostic voltage Vd is maintained to be equal to or higher than the lower limit Vth1 of the operable voltage range of the communication circuit 22 after the unit time has elapsed since the turn-off of the shutoff switch 24.

In this modification, the diagnostic voltage Vd cannot necessarily become lower than the lower limit of the output voltage range of the constant-voltage power source 23 after the opening of the shutoff switch 24. The predetermined amount can be set to a maximum drop of the output voltage VC of the constant-voltage power source 23 if the shutoff switch 24 is in the on state, i.e. the closed state.

External devices connected to each of the I/O modules 20, 30, and 40 are not limited to the emergency stop switch 110 and the programmable logic controller 100. Other control devices except for programmable logic controllers or other safety devices, such as enable switches or light curtains, can be used as the external devices. The programmable logic controller 100 can control other devices, such as a belt conveyor system.

In each of the first to fourth embodiments, the single first external device, such as the programmable logic controller 100, is connected to the corresponding I/O module, but plural first external devices can be connected to each of the I/O modules 20, 30, and 40. Similarly, plural second external devices can be connected to each of the I/O modules 20, 30, and 40.

In each of the first and second embodiments, the MCU 21 and the communication circuit 22 can be integrated as a single device serving as a communication controller.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. An I/O module to which a first external device and a second external device are connected, the I/O module comprising:
   a communication controller connected via a power supply path to a voltage source that has a predetermined output voltage range, the communication controller having an operable voltage range, and being configured to:
      enable communications between the first external device and the second external device upon a voltage supplied from the voltage source being equal to or higher than a lower limit of the operable voltage range; and
      disable communications between the first external device and the second external device upon the voltage supplied from the voltage source being lower than the lower limit of the operable voltage range;
   a shutoff switch provided on the power supply path; and
   a capacitor connected to a point of the power supply path, the point being located between the shutoff switch and the communication controller, the capacitor being charged based on the voltage supplied from the voltage source while the shutoff switch is in an on state, the capacitor being configured to supply an operating voltage to the communication controller while the shutoff switch is in an off state, a lower limit of the output voltage range of the power source being set to be higher than the lower limit of the operable range,
   the communication controller being configured to:
      detect a voltage across the capacitor as a diagnostic voltage;
      output a turn-off command to the shutoff switch for turning off the shutoff switch to perform a diagnostic task that determines whether there is a fixedly closed malfunction in the shutoff switch based on determination of whether the diagnostic voltage is lower than the lower limit of the output voltage range while outputting the turn-off command to the shutoff switch;
      determine that there is no fixedly closed malfunction in the shutoff switch when determining that the diagnostic voltage is lower than the lower limit of the output voltage range, thus outputting a turn-on command to the shutoff switch for turning on the shutoff switch while the diagnostic voltage is within a range from the lower limit of the output voltage range and the lower limit of the operable voltage range; and
      determine that there is a fixedly closed malfunction in the shutoff switch when determining that the diagnostic voltage is equal to or higher than the lower limit of the output voltage range.

2. The I/O module according to claim 1, wherein:
   the communication controller is configured to:
      output the turn-off command to the shutoff switch for a predetermined reference period, the reference period being defined such that, if the shutoff switch is turned off by the turn-off command, the diagnostic voltage is estimated to have decreased down to a predetermined reference voltage when the reference period has elapsed since the turn-off of the shutoff switch, the predetermined reference voltage being set to be lower than the lower limit of the output voltage range and to be equal to or higher than the lower limit of the operable voltage range; and
      determine whether the diagnostic voltage is lower than the lower limit of the output voltage range during the predetermined reference period.

3. The I/O module according to claim 1, wherein:
   the communication controller is configured to output the turn-on command to the shutoff switch when the diagnostic voltage has dropped to a predetermined reference voltage since the output of the turn-off command to the shutoff switch, the predetermined reference voltage being set to be lower than the lower limit of the output voltage range and to be equal to or higher than the lower limit of the operable voltage range.

4. The I/O module according to claim 1, wherein:
   the communication controller is configured to:
      perform a communication task associated with communications between the first external device and the second external device;
      alternately output the turn-on command to the shutoff switch for turning on the shutoff switch and the turn-off command to the shutoff switch for turning off the shutoff switch;
      perform the diagnostic task while outputting each of the turn-off commands to the shutoff switch; and
      perform the communication task while outputting each of the turn-on commands to the shutoff switch.

5. The I/O module according to claim 4, wherein:
   the first external device is a programmable logic controller configured to output various operation commands to a controlled target device;

the second external device is a safety device configured to output an emergency stop signal to the communication controller; and the communication controller is configured to perform the communication task that sends the emergency stop signal to the programmable logic controller when the emergency stop signal is input thereto from the safety device, the programmable logic controller being configured to output an emergency stop command to the controlled target device, thus forcibly shutting down the controlled target device.

6. The I/O module according to claim 1, wherein:

the first external device is a programmable logic controller configured to output various operation commands to a controlled target device, when the communication controller shutting off communications between the programmable logic controller and the second external device, the programmable logic controller being configured to output an emergency stop command to the controlled target device, thus forcibly shutting down the controlled target device.

7. An I/O module to which a first external device and a second external device are connected, the I/O module comprising:

a communication controller connected via a power supply path to a voltage source that has a predetermined output voltage range, the communication controller having an operable voltage range, and being configured to:
enable communications between the first external device and the second external device upon a voltage supplied from the voltage source being equal to or higher than a lower limit of the operable voltage range; and
disable communications between the first external device and the second external device upon the voltage supplied from the voltage source being lower than the lower limit of the operable voltage range; and a shutoff switch provided on the power supply path; and a capacitor connected to a point of the power supply path, the point being located between the shutoff switch and the communication controller, the capacitor being charged based on the voltage supplied from the voltage source while the shutoff switch is in an on state, the capacitor being configured to supply an operating voltage to the communication controller while the shutoff switch is in an off state, the communication controller being configured to:
detect a voltage across the capacitor as a diagnostic voltage;
output a turn-off command to the shutoff switch for turning off the shutoff switch to perform a diagnostic task that determines whether there is a fixedly closed malfunction in the shutoff switch based on determination of whether an amount of drop of the diagnostic voltage per unit time is greater than a predetermined threshold amount while outputting the turn-off command to the shutoff switch;
determine that there is no fixedly closed malfunction in the shutoff switch when determining that the amount of drop of the diagnostic voltage per unit time is greater than the predetermined threshold amount; and
determine that there is a fixedly closed malfunction in the shutoff switch when determining that the amount of drop of the diagnostic voltage per unit time is equal to or smaller than the predetermined threshold amount, the unit time being determined such that, if the shutoff switch is turned off in response to the turn-off command, the diagnostic voltage is maintained to be equal to or higher than the lower limit of the operable voltage range after the unit time has elapsed since the turn-off of the shutoff switch.

8. The I/O module according to claim 7, wherein:

the first external device is a programmable logic controller configured to output various operation commands to a controlled target device, when the communication controller shutting off communications between the programmable logic controller and the second external device, the programmable logic controller being configured to output an emergency stop command to the controlled target device, thus forcibly shutting down the controlled target device.

9. An I/O module to which a first external device and a second external device are connected, the I/O module comprising:

a communication controller configured to enable communications between the first external device and the second external device upon a voltage being supplied from a power source thereto;

a shutoff switch configured to shut off supply of the voltage to the communication controller when turned off; and a capacitor configured to be charged based on the voltage supplied from the voltage source while the shutoff switch is in an on state, the capacitor being configured to supply an operating voltage to the communication controller while the shutoff switch is turned off, the communication controller being configured to:
detect a voltage across the capacitor as a diagnostic voltage;
output a turn-off command to the shutoff switch for turning off the shutoff switch; and
determine whether there is a fixedly closed malfunction in the shutoff switch based on the diagnostic voltage while outputting the turn-off command to the shutoff switch.

10. The I/O module according to claim 9, wherein:

the communication controller is configured to:
determine that there is no fixedly closed malfunction in the shutoff switch when determining that the diagnostic voltage is lower than a predetermined threshold value; and
determine that there is a fixedly closed malfunction in the shutoff switch when determining that the diagnostic voltage is equal to or higher than the predetermined threshold voltage.

* * * * *